US 8,404,572 B2

(12) United States Patent
Chang et al.

(10) Patent No.: US 8,404,572 B2
(45) Date of Patent: Mar. 26, 2013

(54) MULTI-ZONE TEMPERATURE CONTROL FOR SEMICONDUCTOR WAFER

(75) Inventors: Chun-Lin Chang, Jhubei (TW);
Hsin-Hsien Wu, Hsinchu (TW);
Zin-Chang Wei, Hsin-Chu (TW);
Chi-Ming Yang, Hsian-San District (TW); Chyi-Shyuan Chern, Taipei (TW); Jun-Lin Yeh, Taipei (TW);
Jih-Jse Lin, Sijhih (TW); Jo-Fei Wang, Hsin-Chu (TW); Ming-Yu Fan, HsinChu County (TW); Jong-I Mou, Hsinpu Township, Hsinchu County (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 932 days.

(21) Appl. No.: 12/370,746

(22) Filed: Feb. 13, 2009

(65) Prior Publication Data

US 2010/0210041 A1    Aug. 19, 2010

(51) Int. Cl.
*H01L 21/425* (2006.01)

(52) U.S. Cl. .......... 438/515; 438/514; 250/492.21; 165/80.4; 361/234; 361/711

(58) Field of Classification Search .......... 250/492.21; 165/80.4; 361/711, 234; 438/515
See application file for complete search history.

(56) References Cited

U.S. PATENT DOCUMENTS

| | | | |
|---|---|---|---|
| 5,155,337 A | 10/1992 | Sorrell et al. | |
| 5,296,385 A | 3/1994 | Moslehi et al. | |
| 5,609,720 A | 3/1997 | Lenz et al. | |
| 5,618,461 A | 4/1997 | Burke et al. | |
| 5,846,375 A | 12/1998 | Gilchrist et al. | |
| 5,861,609 A | 1/1999 | Kaltenbrunner et al. | |
| 6,740,853 B1 | 5/2004 | Johnson et al. | |
| 6,759,632 B2 | 7/2004 | Ducret et al. | |
| 2003/0228772 A1 | 12/2003 | Cowans | |
| 2004/0052511 A1 | 3/2004 | Ducret et al. | |
| 2008/0017104 A1* | 1/2008 | Matyushkin et al. | 118/696 |
| 2008/0032426 A1 | 2/2008 | Michaelson et al. | |
| 2008/0092818 A1* | 4/2008 | Fink et al. | 118/724 |
| 2010/0181501 A1* | 7/2010 | Pollock | 250/492.21 |

OTHER PUBLICATIONS

Designing Tracks for Better CD Control—Sep. 1, 2003—Semiconductor International, pp. 1 of 9 at http://www.semiconductor.net/article/CA319214.html Dec. 14, 2008.
Official action issued by SIPO on Mar. 30, 2011.

* cited by examiner

*Primary Examiner* — Michael Lebentritt
*Assistant Examiner* — Aaron Dehne
(74) *Attorney, Agent, or Firm* — Duane Morris LLP

(57) ABSTRACT

An apparatus includes a process chamber configured to perform an ion implantation process. A cooling platen or electrostatic chuck is provided within the process chamber. The cooling platen or electrostatic chuck is configured to support a semiconductor wafer. The cooling platen or electrostatic chuck has a plurality of temperature zones. Each temperature zone includes at least one fluid conduit within or adjacent to the cooling platen or electrostatic chuck. At least two coolant sources are provided, each fluidly coupled to a respective one of the fluid conduits and configured to supply a respectively different coolant to a respective one of the plurality of temperature zones during the ion implantation process. The coolant sources include respectively different chilling or refrigeration units.

20 Claims, 13 Drawing Sheets

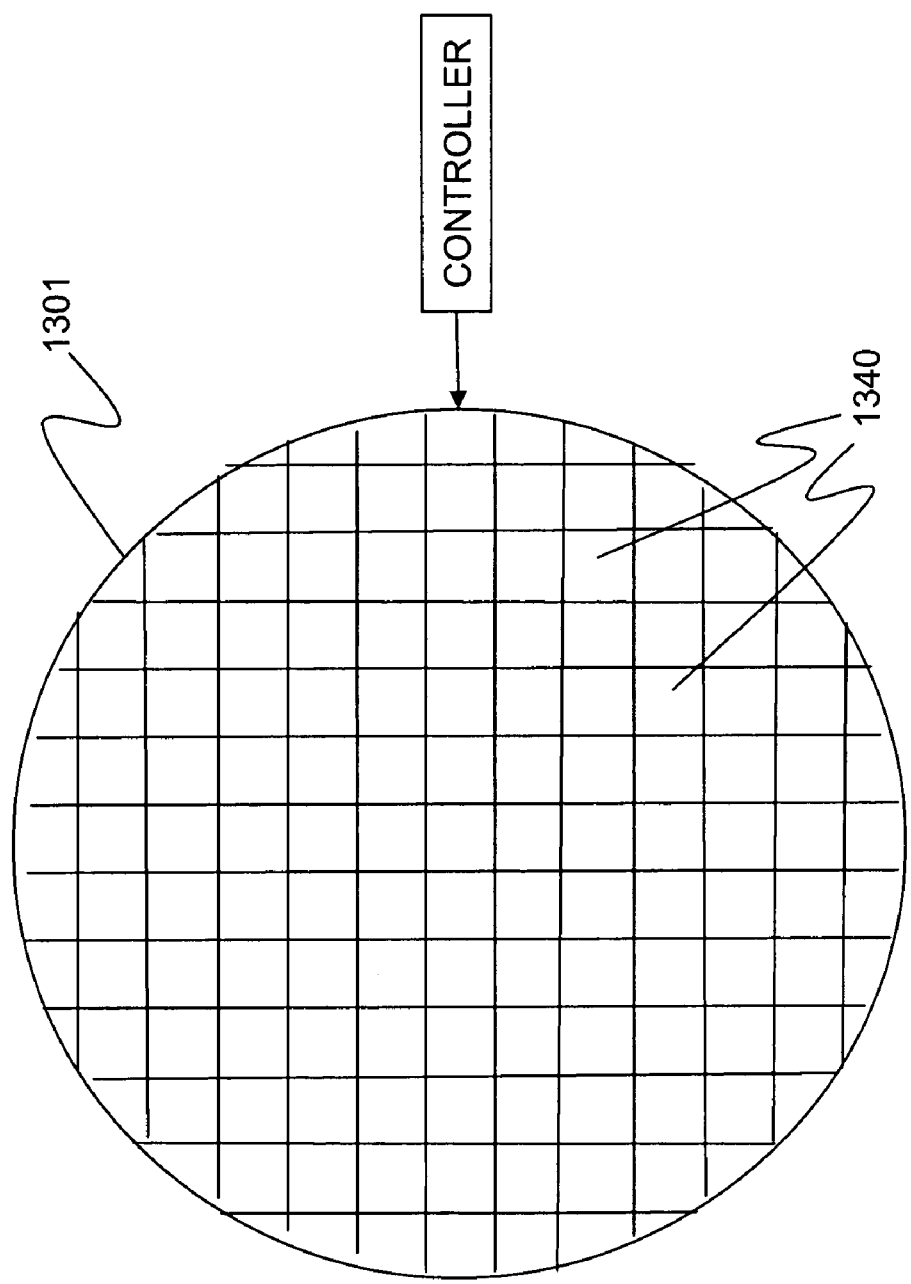

US 8,404,572 B2

MULTI-ZONE TEMPERATURE CONTROL FOR SEMICONDUCTOR WAFER

FIELD OF THE INVENTION

The present disclosure relates to semiconductor fabrication processes and equipment.

BACKGROUND

The semiconductor chip fabrication industry continues to strive for reductions in costs. One of the major strategies to reduce the production cost per chip is to migrate towards the use of larger diameter semiconductor wafers. Current semiconductor foundries primarily use 200 mm (8 inch) and 300 mm (12 inch) silicon wafers. By migrating to use of 450 mm wafers, the number of dies (of the same size) produced from each wafer will increase approximately in proportion to the growth in the area of the wafer. Thus, a 450 mm wafer can yield 2.25 times as many chips as a 300 mm wafer.

Processing larger wafers introduces mechanical challenges. One of the methods of providing a reliable process with a high yield is strict control over processing conditions. Because a 450 mm wafer has a larger diameter and surface area, it is more difficult to attain and maintain a uniform environment throughout the wafer while processing. For example, several processing steps are performed at specific temperatures. If heat or cooling is applied at discrete locations on the wafer, hot spots or cold spots may occur on the wafer. Additionally, secondary sources of heating and cooling (e.g., radiative heat transfer to or from the chamber walls) may affect the wafer unevenly. If the wafer temperature is not uniform throughout the wafer, then local variations may occur in various processing steps, causing within die variations and within wafer (between die) variations, such as line width variations.

SUMMARY OF THE INVENTION

In some embodiments, an apparatus comprises a process chamber configured to perform an ion implantation process. An electrostatic chuck is provided within the process chamber. The electrostatic chuck is configured to support a semiconductor wafer. The electrostatic chuck has a plurality of temperature zones. Each temperature zone includes at least one fluid conduit within or adjacent to the electrostatic chuck. At least two coolant sources are provided. Each coolant source is fluidly coupled to a respective one of the fluid conduits and configured to supply a respectively different coolant to a respective one of the plurality of temperature zones during the ion implantation process. The at least two coolant sources include respectively different chilling or refrigeration units.

In some embodiments, a method comprises performing an ion implantation process on a semiconductor wafer supported by an electrostatic chuck. First and second different coolant fluids are supplied to respective first and second fluid conduits in or adjacent to the electrostatic chuck in respective first and second zones of the electrostatic chuck, to independently control the temperature of the wafer in respective first and second portions of the wafer adjacent to the first and second zones of the electrostatic chuck during the ion implantation process.

In some embodiments, a method comprises etching a circuit pattern in a first film of a film material on a first semiconductor substrate. A critical dimension (CD) of the circuit pattern is measured at a plurality of locations. A single wafer chamber that forms a second film of the film material on a second semiconductor substrate is adjusted, based on the measured CD, so as to locally adjust a thickness of the second film. The second film is formed on the second semiconductor substrate using the adjusted single wafer chamber.

In some embodiments, an apparatus comprises a processor for receiving a plurality of measurements of a critical dimension (CD) at respective locations in a circuit pattern etched from a film comprising a film material on a first semiconductor substrate. A single wafer chamber is provided for forming a second film of the film material on a second semiconductor substrate. The single wafer chamber is responsive to a control signal from the processor to locally adjust a thickness of the second film based on the measurements of the CD.

In some embodiments, an apparatus comprises a process chamber configured to perform a substrate coating or photoresist development step. The process chamber has a hot plate for supporting a semiconductor substrate. The hot plate has a plurality of independently movable heating elements. A controller is provided for controlling independent adjustments to positions of the movable heating elements.

In some embodiments, a method comprises measuring a critical dimension at a plurality of locations on a first semiconductor substrate supported by a hot plate. Positions at which heat is applied to a second substrate by a plurality of independently controllable heating elements on the hot plate are independently adjusted, The adjusting is based on the measured critical dimension. Heat is applied to the second substrate at the positions while coating the second substrate or developing a photoresist on the second substrate.

BRIEF DESCRIPTION OF THE DRAWINGS

FIG. 13 is a schematic diagram of an alternative heating mechanism.

DETAILED DESCRIPTION

Figure 1:
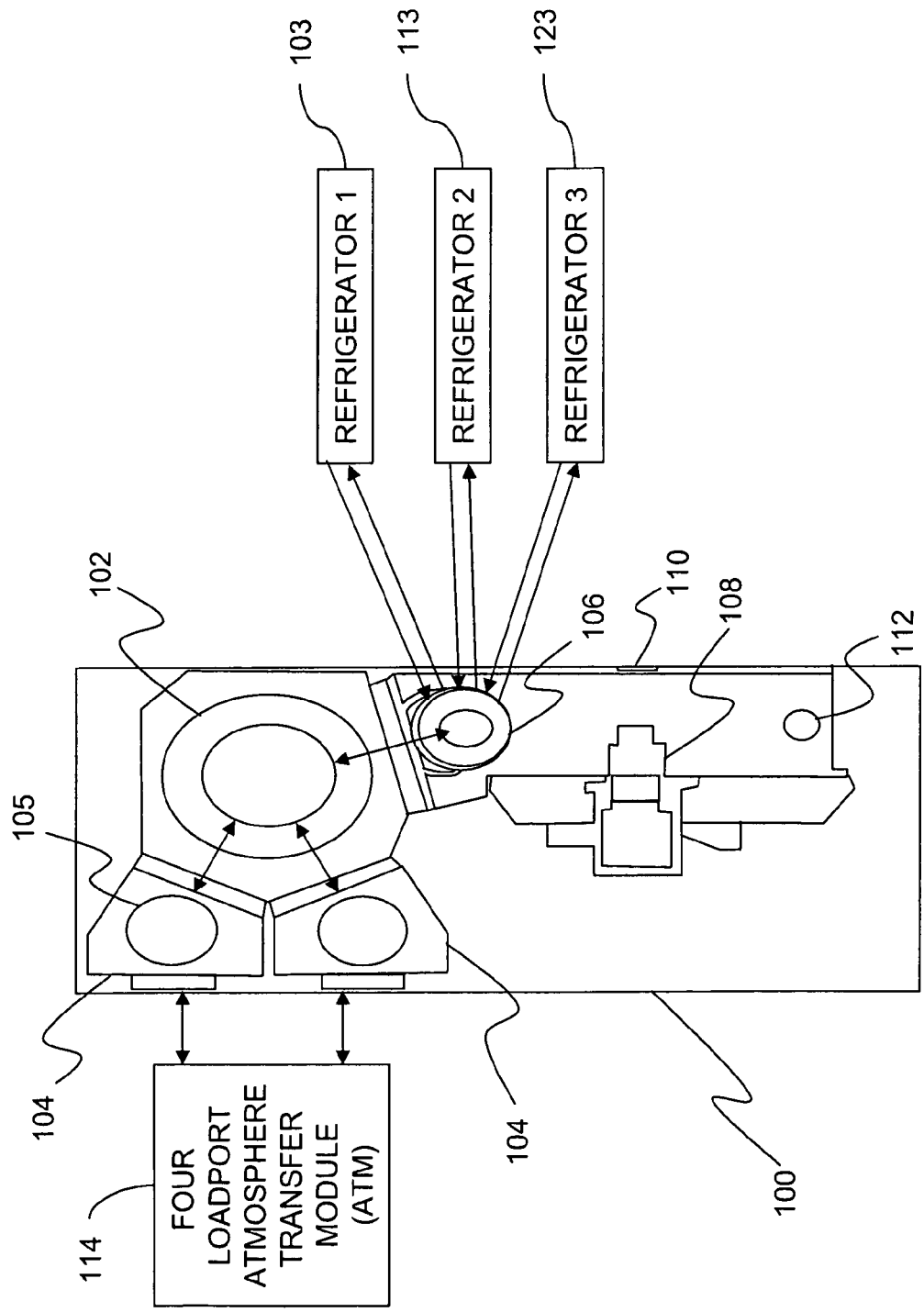
FIG. 1 is a schematic diagram of a semiconductor processing tool.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 shows an implantation tool 100. The tool 100 has a wafer transfer chamber 102, which maintains the wafers in a sealed vacuum environment. A plurality of loadlocks 104 are connectible to the wafer transfer chamber 102. The loadlocks 104 can vent to atmospheric pressure. The loadlocks 104 are configured to receive wafers 105 from the four-loadport atmosphere-transfer module 114, or other robotic device. The loadlocks 104 are then sealed shut and evacuated to vacuum pressure. The wafers 105 can then be transferred to the wafer transfer chamber 102 without interrupting the vacuum or process flow in wafer transfer chamber 102. The wafers 105 are transferred from the wafer transfer chamber 102 to the process cooling platen or electrostatic chuck (e-chuck) 106 of the process chamber 112. The process cooling platen or e-chuck 106 is cooled by a plurality of refrigerants supplied in cooling lines by a first refrigerator (compressor) 103, a second refrigerator 113, and a third refrigerator 123 for cooling to lower temperatures. The process chamber 112 has a scan motor 108 that produces an ion beam 110 for the implantation process step.

Implantation is performed by bombarding the wafer 105 with an ion beam. Junction leakage can be generated by substrate damage from ion implantation. A low temperature ion implantation process will reduce the substrate damage to eliminate end-of-range (EOR) defects (at the interface between amorphous layer and crystalline layer). Low temperature implantation bombardment of ions creates a totally amorphous region in the target crystal, i.e. one in which no specific crystal structure is present. Performing annealing following the low temperature implantation encourages the implanted region ÿ i.e. the layer represented by the depth to which the bombarding ions have penetrated ÿ to recrystallize into a layer which resembles an epitaxial growth portion, giving this technique the name "solid-phase-epitaxy." The low implantation temperature should be uniform throughout the wafer.

The inventor has determined that when a conventional cooling platen is used for low temperature ion implantation, the temperature of the wafer varies, and is approximately a function of the radial position on the wafer. For example, if a cooling gas is supplied at the center of the wafer, the center will have the lowest temperature, and the periphery of the wafer will have the highest temperature. In such a configuration, as the radius of the wafer is increased to 450 mm, the potential temperature difference between center and periphery may be larger. This can result in non-uniform crystalline structure throughout the wafer, leading to non-uniform device performance.

Figure 2:
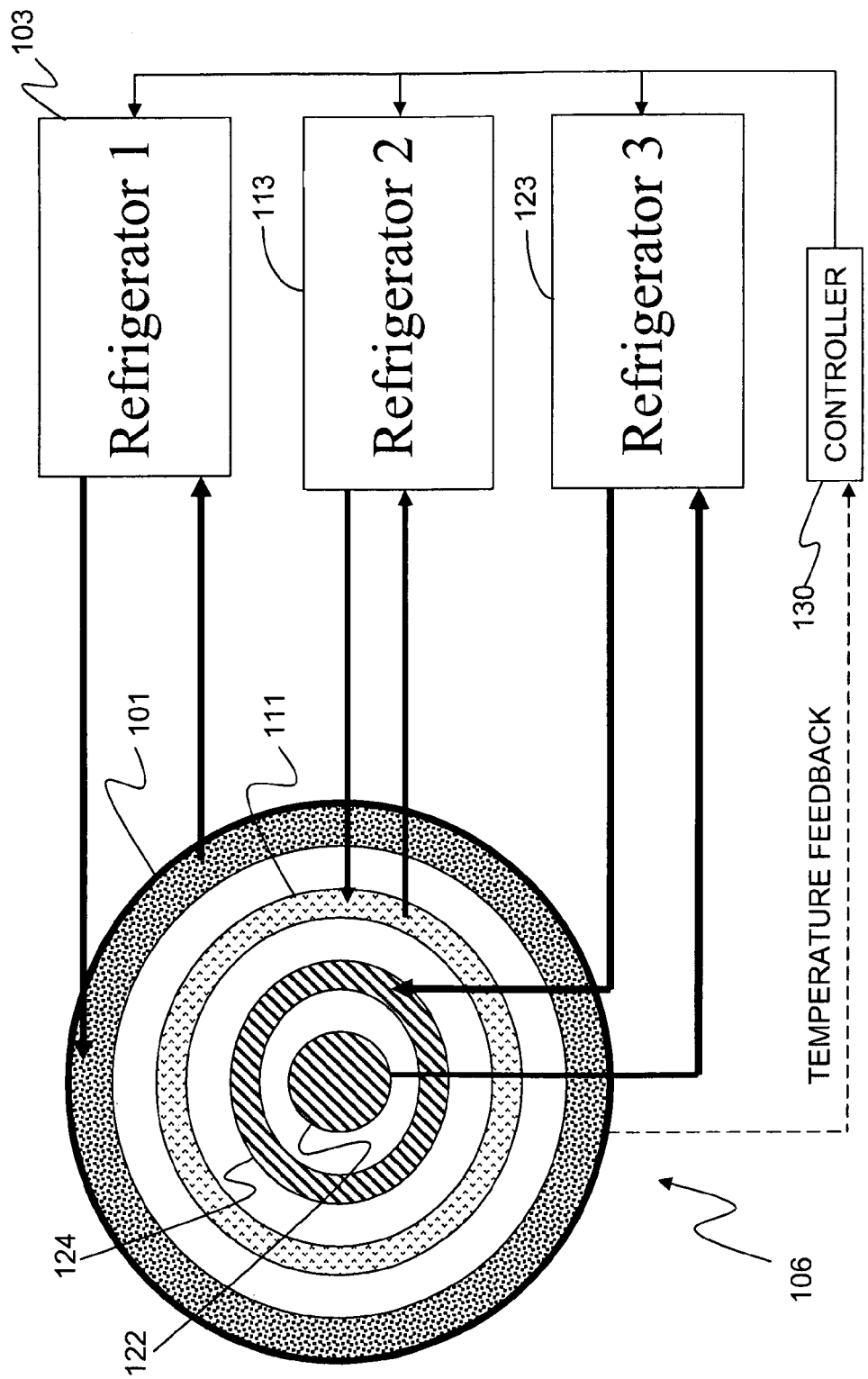
FIG. 2 is a diagram of the cooling platen of FIG. 1.

FIG. 2 is a more detailed diagram of an exemplary multi-zone cooling platen or e-chuck 106 of the process chamber 112. The platen or e-chuck 106 is suitable for within-wafer temperature control during the implantation process. By providing a uniform desired temperature throughout the wafer during implantation, improvements in critical dimension (CD) uniformity, are possible, which makes it possible to improve within-wafer junction leakage performance, and threshold voltage uniformity, and to reduce or eliminate Ni piping defects.

The platen or e-chuck 106 within the process chamber 112 is configured to support a semiconductor wafer. The platen or e-chuck 106 has a plurality of temperature zones 101, 111, 122 and 124, where regions 122 and 124 form a single temperature control zone. Each temperature zone 101, 111, and 122, 124 includes at least one fluid conduit within or adjacent to the electrostatic chuck, as shown in detail with reference to FIGS. 3 and 4. The platen or e-chuck 106 has at least two coolant sources 103, 113, and 123. Each coolant source 103, 113, 123 is fluidly coupled to a respective one of the fluid conduits in respective temperature control zones 101, 111 and 122, 124. Each coolant source 103, 113, 123 is configured to supply a respectively different coolant to a respective one of the plurality of temperature zones.

In some embodiments, the at least two coolant sources including respectively different chilling or refrigeration units 103, 113, and 123 configured to supply respectively different coolants at respectively different temperatures. For example, the coolants may be cryogenic fluids, such as coolants from the group consisting of liquid hydrogen (20 K, −253 C.), liquid helium (3 K, −270 C.), liquid nitrogen (77 K, −196 C.), liquid oxygen (90 K, −183 C.), liquid methane (112 K, −162 C), and liquid nitrous oxide (88 K, −185 C). Thus, the cooling platen or e-chuck 106 can be cooled to a selected one of these temperatures. Alternatively, a refrigerated, non-cryogenic coolant may be used to provide a temperature of about −50 C., 0 C., or 5 C. Depending on the configuration of the cooling platen or e-chuck 106, and the thermal conductance of the materials therein, the wafer temperature may be a few degrees higher than the temperature of the coolant.

In the example of FIG. 2, the plurality of temperature zones include a plurality of concentric annular zones 101, 111, and 122, 124. Annular temperature control zones are generally suitable for a cylindrical wafer in which the local temperature is generally a function of the radial coordinate in a cylindrical polar coordinate system having its center at the center of the wafer.

Although FIG. 2 shows three temperature control zones 101, 111 and 122, 124, in alternative embodiments, any number of two or more temperature control zones may be included.

In some configurations, the temperature distribution may also vary with the tangential polar coordinate of the wafer (e.g., if the platen or e-chuck 106 is on positioned a pedestal having an axially asymmetric internal structure that does not distribute heat evenly). In such configurations, each radial temperature zone may be subdivided into two, three or four angular zones, to provide more precise temperature control for greater temperature uniformity during ion implantation.

A temperature controller 130 is provided for independently controlling the supply of the respectively different coolants from the refrigerators 103, 113, 123 to the plurality of temperature zones at respectively different temperatures so as to maintain a substantially uniform wafer temperature across the wafer. Temperature feedback is used to control the temperature in each zone. The temperature feedback may be collected by a plurality of sensors on or in the platen or e-chuck 106. Alternatively, an image of the temperature distribution may be collected.

If cryogenic coolants are used, each coolant is supplied at substantially constant supply temperatures. The amount of heat removed from each zone can be controlled either by varying the duty cycle of coolant flow (with a constant flow rate), or by varying the volumetric flow rate of the coolant in each temperature zone 101, 111, and 122, 124. Controller 130 may have a table indicating an appropriate coolant flow rate or duty cycle for each of the coolant sources as a function of the average temperature in the zone controlled by each respective coolant source.

In other embodiments, (e.g., if non-cryogenic coolants are used), one or more of the refrigerators 103, 113, and 123 may be capable of providing an individual coolant over a range of temperatures, so that the temperature of one or more of the zones 101, 111, and 122, 124 may be controlled by varying the coolant supply temperature within that (those) zone(s).

By supplying different coolants in different radial zones, radial variations in the wafer temperature can be minimize or avoided. For example, the first coolant fluid (e.g., liquid methane at −162 C) may be provided in or adjacent to an inner annular zone 122, 124 of the platen or e-chuck 106 and the second coolant fluid (e.g., liquid nitrogen at −196 C) may be provided in an outer annular zone 111 of the platen or e-chuck 106, where the second coolant has a lower boiling temperature than the first coolant.

Figure 3:
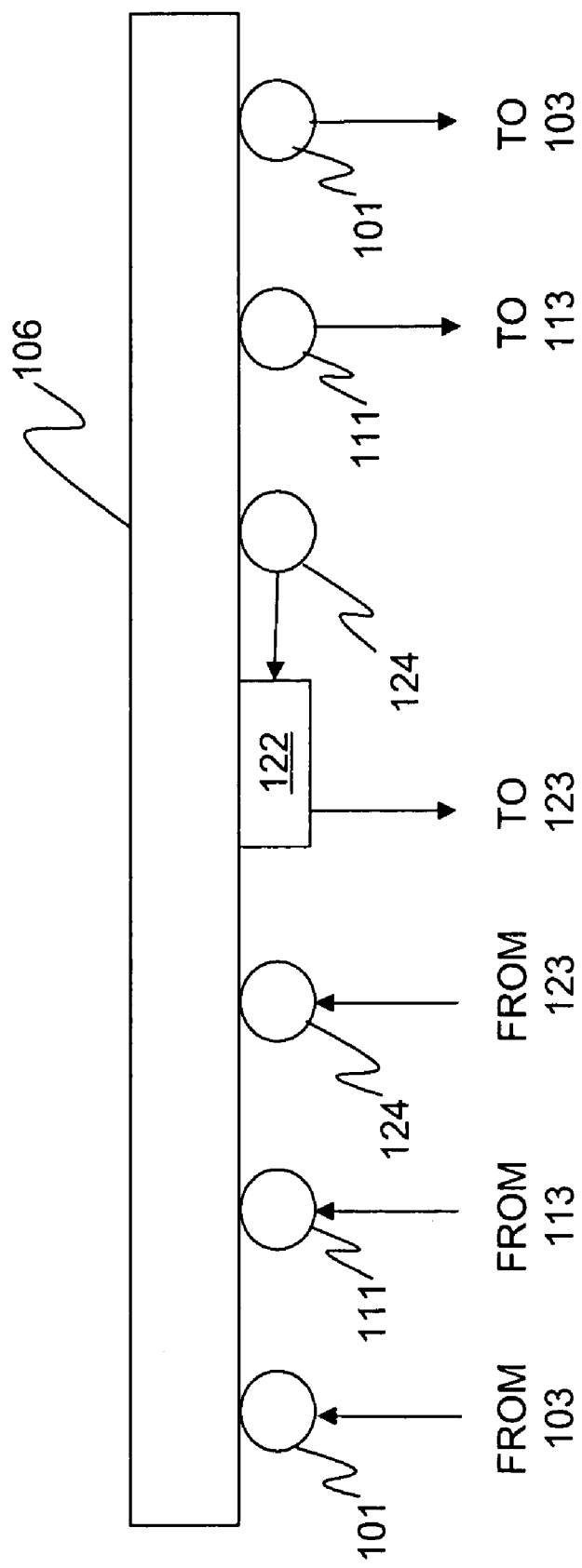
FIG. 3 is a schematic diagram of side view of the platen of FIG. 2.
Figure 4:
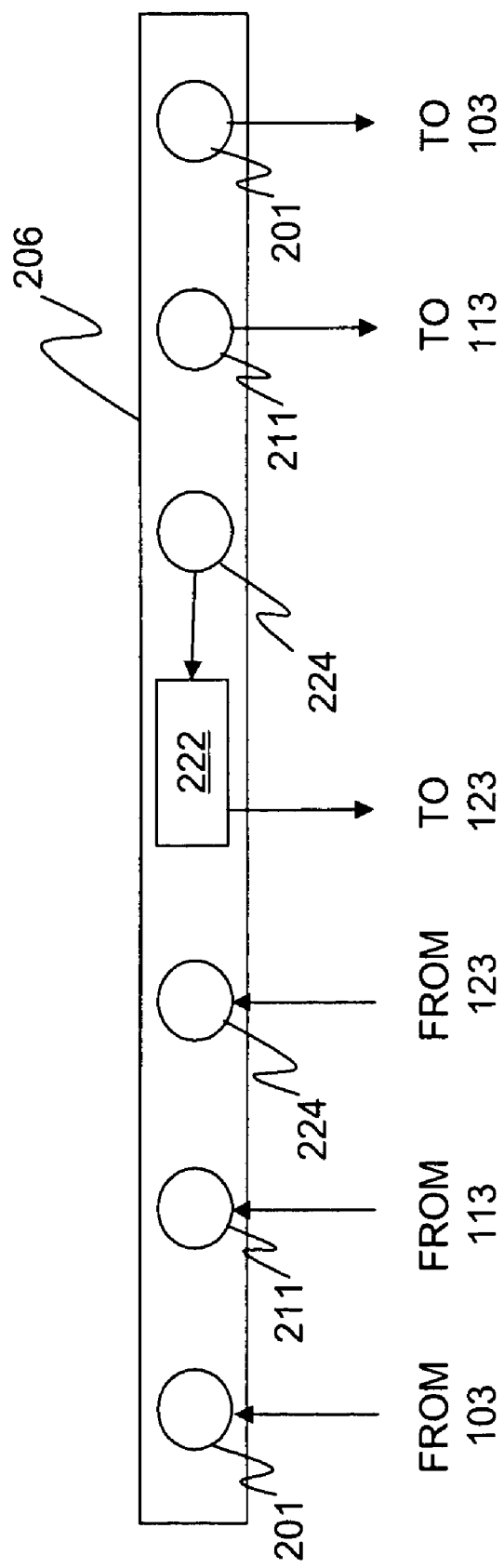
FIG. 4 is a variation of the platen shown in FIG. 3.

FIGS. 3 and 4 show two examples of configurations for the platen or e-chuck. In FIG. 3, the coolant fluid conduits 101, 111 and 124 are tubes arranged on a back surface of the platen 106. This configuration may be achieved by welding or otherwise joining the tubing to the back surface. FIG. 4 shows a configuration in which the conduits 201, 211 and 222, 224 are formed inside the platen or e-chuck 206. The configuration of FIG. 4 provides improved thermal coupling between the coolant and the platen or e-chuck 206, relative to the device shown in FIG. 3.

Figure 5:
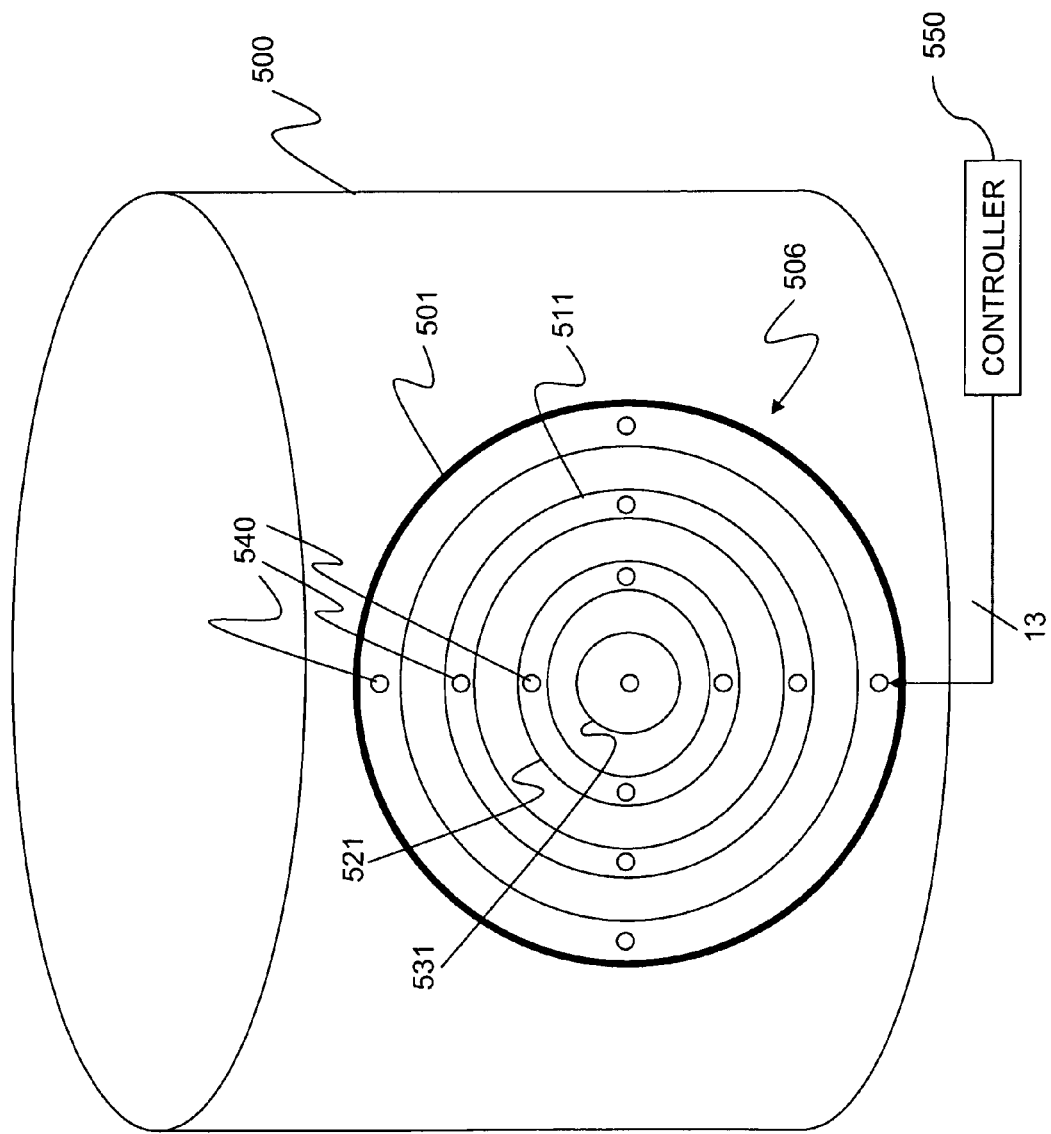
FIG. 5 is a schematic diagram of a tool having a film deposition chamber.
Figure 6:
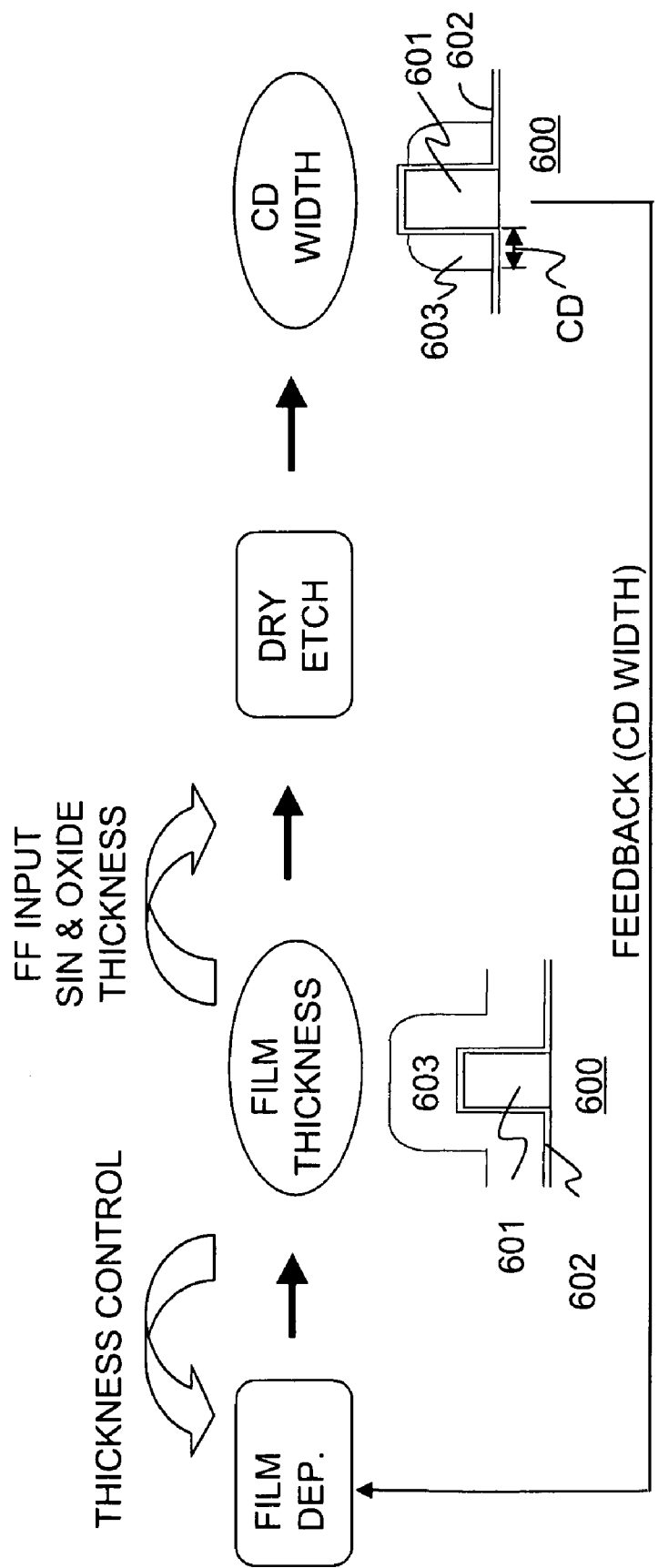
FIG. 6 is a process schematic diagram for the tool of FIG. 5, showing feedforward and feedback.
Figure 7:
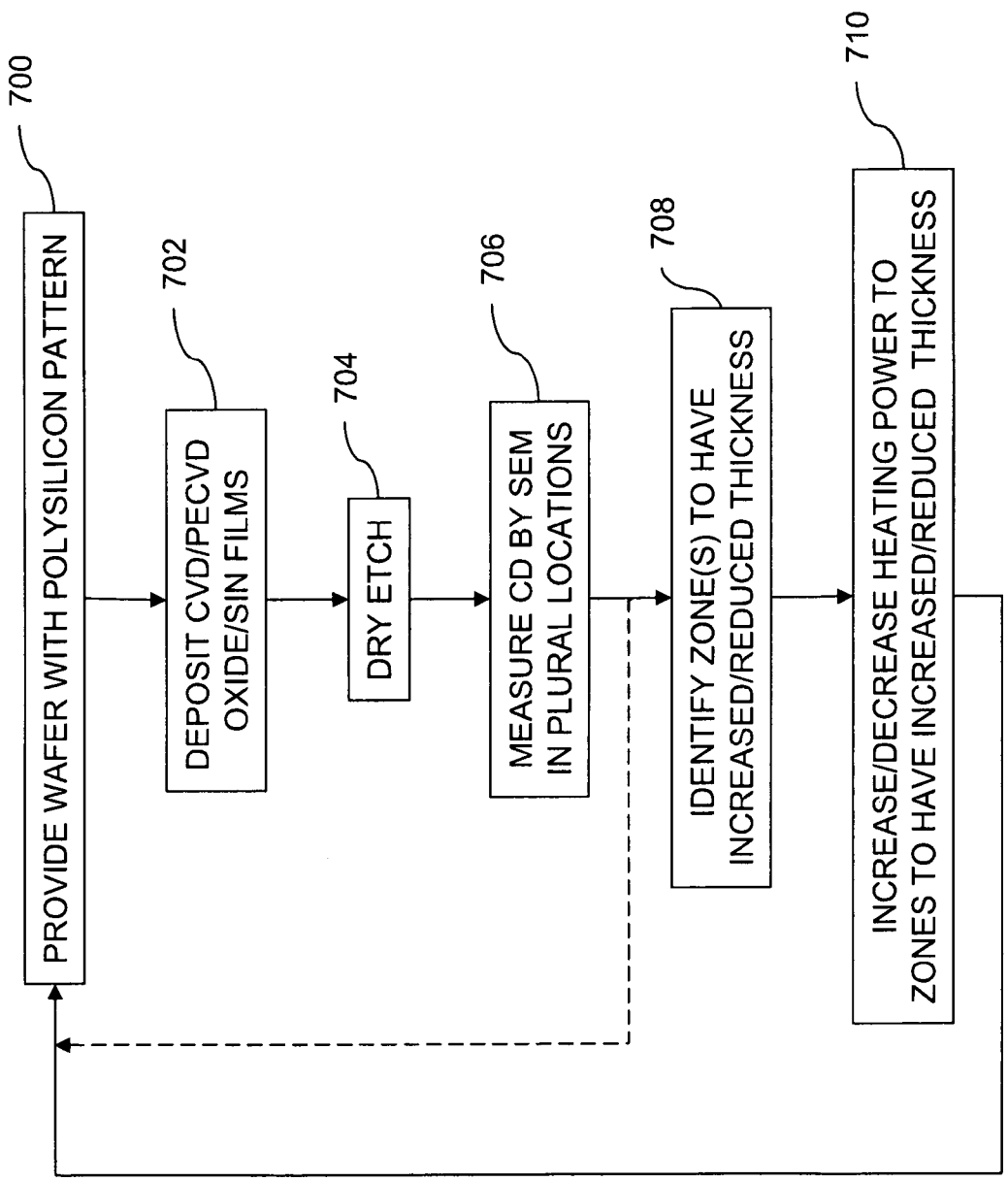
FIG. 7 is a flow chart of the process performed in the tool of FIG. 5.

Although FIGS. 1-4 relate to the ion implantation process step, multiple zone temperature control may be used in other portions of the semiconductor integrated circuit fabrication process. FIGS. 5-7 relate to use of multiple-zone temperature control in film deposition processes, such as chemical vapor deposition (CVD), plasma enhanced CVD (PECVD) or physical vapor deposition (PVD).

FIG. 6 is a schematic process diagram of a metal oxide semiconductor (MOS) process. A substrate 600 has a polysilicon gate electrode 601 thereon. A liner layer 602 such as a thin conformal oxide layer is formed on the sidewalls of the polysilicon gate electrode 601 and on the substrate 600. A conformal silicon nitride (SiN) layer 603 is formed over the liner layer 602. An isotropic (dry) etch process is performed, etching away the SiN layer 603 above the polysilicon gate 601. As a result, spacers 603 are formed beside the polysilicon gate 601 on the liner layers 602. The spacers 603 may be used during the step of forming lightly doped drain (LDD) regions (not shown) in the substrate 600.

To control the size of the LDD regions, a critical dimension (CD) shown in FIG. 6 is controlled. The inventor has determined that the CD can be controlled by controlling the thickness of the SiN layer 603, and the CD uniformity (CDU) can be controlled by controlling the uniformity of the thickness of the SiN layer 603. Further, the thickness uniformity of the SiN layer 603 and the CDU can be controlled by independently controlling the local temperature of the wafer in a plurality of independently controllable zones.

In some embodiments, a single wafer deposition chamber is used to tune the specific thickness distribution using multiple heater zone for film deposition and etch matching. The inventor has determined that a single-wafer chamber provides a wafer temperature distribution that is substantially axially symmetric. An axially symmetric temperature distribution can be more easily compensated by a plurality of annular heating zones.

FIG. 5 is a schematic diagram of a single wafer deposition chamber 500 for depositing a film by a CVD or PECVD process (or other anisotropic deposition process). A platen 506 is provided for supporting a semiconductor wafer. The platen 506 has a plurality of independently controllable temperature zones 501, 511, 521 and 531. Although FIG. 5 shows four temperature control zones 501, 511, 521 and 531, any desired number of two or more temperature control zones may be used. The larger the number of temperature control zones, the greater the capability to maintain control of the thickness of films 602 and 603, and thus the greater the capability to control the CDU.

At least one heating element 540 is provided in each of the heating zones 501, 511, 521 and 531. Although FIG. 5 shows 13 heating elements 540 arranged in a cross configuration, any number of heating elements may be provided, and the heating elements may be arranged in any desired configuration. The larger the number of heating elements 540, the greater the capability to maintain control of the thickness of films 602 and 603, and thus the greater the capability to control the CDU.

FIG. 6 schematically shows the control process. The exemplary system provides feedback from the actual CD of devices formed by the process and the temperature control for controlling the thickness of the film layers 602, 603. After the etchings step is performed in an etching tool (e.g., a dry etching tool), CD measurements are made at a plurality of locations in circuit patterns on the wafer. The measurements may be performed using a scanning electron microscope (SEM), for example. Preferably, the CD measurements are automatically provided to the controller 550, or to a processor that interfaces with the controller 550.

A processor (e.g., an automatic process controller 550) is provided for receiving the plurality of CD measurements from the respective locations etched from the oxide and SiN films on a first semiconductor substrate. The processor is configured to control the heating elements to increase the local thickness of the second film (on a second wafer), if the CD of the first film (at the same position on the first wafer) is less than a desired dimension, and to decrease the thickness of the second film, if the CD of the first film is greater than the desired dimension. In a film deposition process such as CVD or PECVD, as the temperature of the wafer is increased (while holding other process parameters constant), the thickness of the deposited layer increases.

The controller 550 determines a heating correction to be applied to each temperature zone 501, 511, 521, 531 to achieve thickness uniformity of the film to be applied. For example, the controller 550 may have a table that specifies an increase in heating power to be supplied to each heating element 540 in a given temperature control zone in proportion to the difference between the average CD in that zone and the desired CD.

Although FIG. 5 schematically shows a single controller 550, the control function may be performed by a plurality of processors. For example, a process controller may interface directly with the heating elements 540, and a general processor may provide application program software for controlling the algorithm and data used to implement the feedback between the CD measurements and the power supplied to the heating elements 540. The new heating power levels determined from the SEM CD measurements of a first wafer are then applied to the heating elements 540 when performing a film deposition on a second or subsequent wafer.

Although an example is described above where oxide and SiN films are formed on the wafer, and the width of the SiN spacers is controlled, in other examples, films of other materials may be deposited, and multiple independently controlled temperature zones may be used to control a thickness of the deposited layer, for controlling a CD of another feature.

FIG. 7 is a flow chart showing an example of a method according to FIG. 6.

At step 700 a wafer is provided in the single wafer deposition chamber 500, for deposition of a conformal film by an anisotropic process such as CVD or PECVD.

At step 702, the conformal film is deposited on the substrate 600 in the single wafer deposition chamber. If this is the first wafer being processed, the power supplied to the heating elements 540 in each temperature control zone during the deposition may be set to a default value.

At step 704, the wafer is transferred to an etching tool, such as a plasma etching reaction chamber. A circuit pattern is etched in the first film on a first semiconductor substrate. For example, as shown in FIG. 6, a dry etch step may be used to form the SiN spacers besides a polysilicon gate electrode 601.

At step 706, a CD of the circuit pattern is measured at a plurality of locations. For example, scanning electron microscopy may be used. The plurality of locations should include at least one (and preferably more than one) location in each temperature control zone. For example, in FIG. 6, the CD to be measured is the width of the SiN spacer. By collecting CD measurements in all of the temperature control zones, the CDU is measured.

At step 708, the processor or controller 550 determines which temperature control zones in the single wafer deposition chamber 500 should have increased or decreased thickness to achieve a desired CDU, based on the CDU feedback from the SEM data. In some embodiments, steps 700 to 706 are repeated (e.g., 2 or 3 or more times) before proceeding to the adjustment step 708. In other embodiments, step 708 is performed every time another wafer is processed in steps 700-706. The determination of how often to make the adjustments may be based on several factors, such as stability of the process, the length of time it takes for the platen zone temperatures to adjust to a change in heater power, or a desire to base adjustments on a larger sample of data.

At step 710, the controller 550 adjusts the power supplied to each heating element 540 in the temperature control zones of the single wafer chamber 500, based on the measured CD, so as to locally adjust a thickness of the second film. Each temperature control zone can be adjusted separately, to differentially adjust the thickness to improve CDU. The heating power supplied to a temperature zone is increased to increase the thickness of the film, if the CD of the first wafer is less than a desired dimension. The heating power supplied to a temperature zone is decreased to decrease the thickness of the film, if the CD of the first wafer is greater than a desired dimension.

After step 710, the loop from step 700 to 710 is repeated, so that a second film of the film material is formed on a second semiconductor substrate using the adjusted single wafer chamber.

Another example of a multiple temperature zone system is shown in FIGS. 8A-12. FIGS. 8A-12 enhance the process control capability of the apparatus and method by flexible temperature control in the hot plate or e-chuck through variable position heating elements. By moving individual heating elements 840, the hot plate 801 independently adjusts the positions at which heat is applied to the substrate.

Figure 8A:
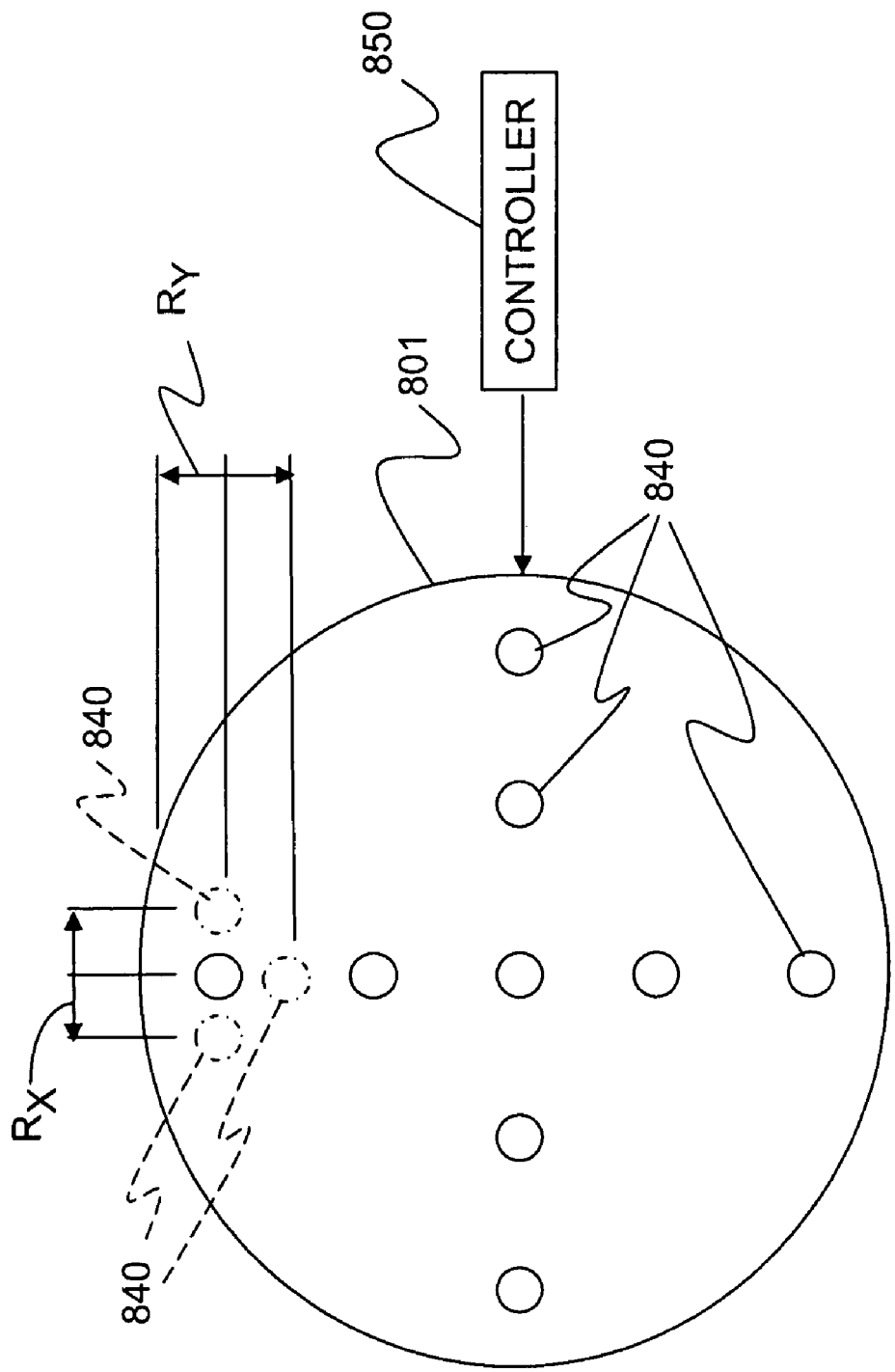
FIG. 8A is a plan view of a hot plate for use in a coater or developer.
Figure 9:
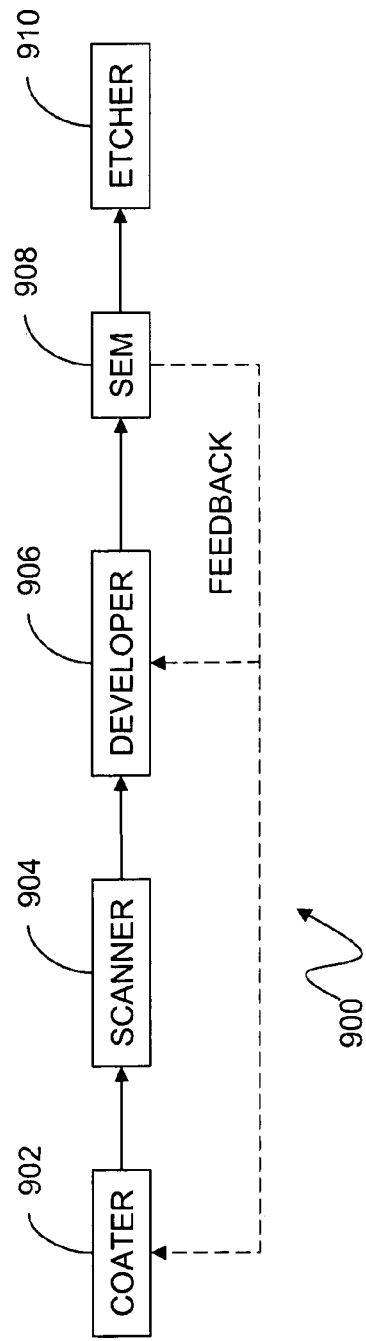
FIG. 9 is a block diagram of a processing line.

FIG. 8A shows a hot plate 801 suitable for use in a photolithography process sequence. The hot plate 801 may be included in a coater 902 (FIG. 9) or a developer 906 (FIG. 9). The hot plate 801 of FIG. 8A has a plurality of heating elements, which may be provided in any desired number and arranged in any desired locations. As indicated in phantom, each heating element 840 is movable in the XY plane, within an X range $R_X$ and a Y range $R_Y$. The movable elements 840 may be moved in the radial and/or tangential directions. The movable elements 840 may be moved into positions to form symmetric or asymmetric arrangements of heating elements. Thus, the movable heating elements may be used to eliminate an asymmetrically shaped zone of increased or decreased temperature. In addition to being movable, the power to each heating element can be varied, to eliminate a local hot spot or cold spot.

Additionally, in the event of a failure of a heating element 840, the remaining heating elements 840 can be rearranged to at least partially compensate for the missing heating element. In addition to being movable, the power to each heating element can be varied, to boost the heating power in the remaining heating elements nearest to the failed heating element.

Figure 8B:
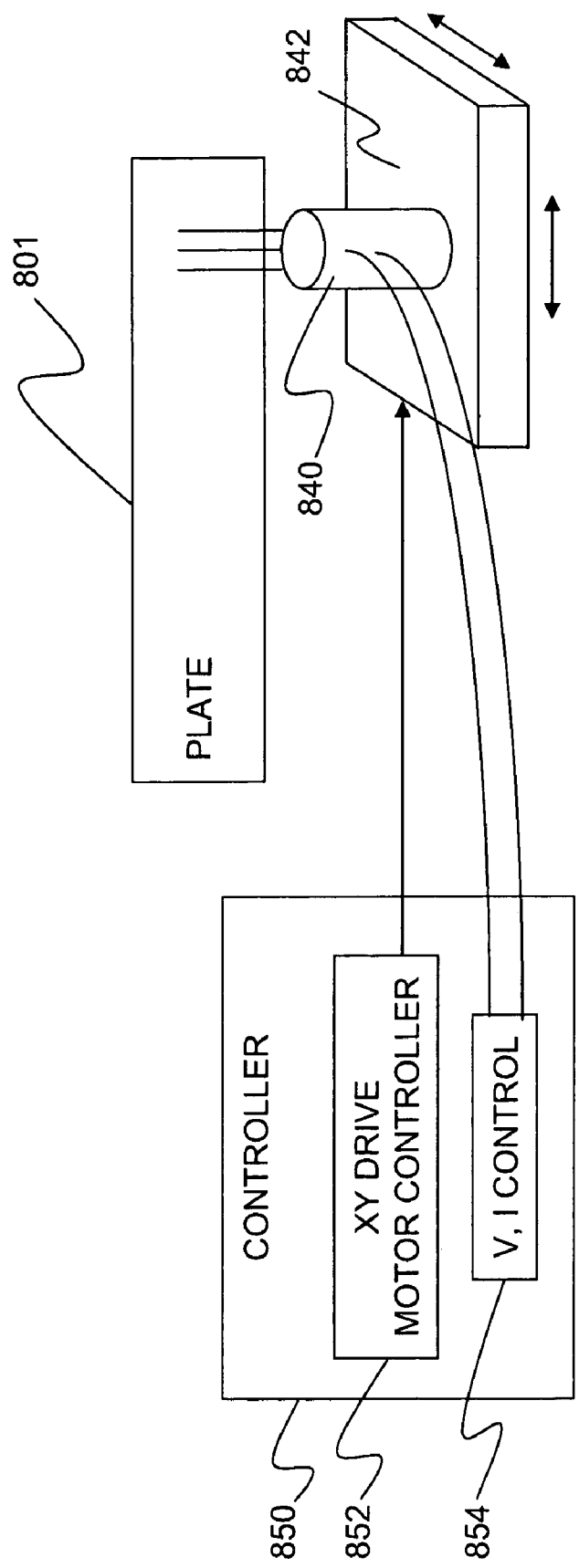
FIG. 8B is a schematic view of the hot plate of FIG. 8A, with a heating element and controls for the heating element.

FIG. 8B is a schematic diagram showing the control of one of the heating elements 840. Only one heating element 840 is shown in FIG. 8B, but one of ordinary skill understands that the rest of the heating elements 840 may be controlled the same way as shown in FIG. 8B.

A respective driver unit 842 is coupled to each respective movable heating element 840, to actuate that heating element in a plane parallel to a wafer-engaging surface of the hot plate 801. A variety of electrically controllable XY stages may be used such as, but not limited to, an XY stage suitable for use in a stepper. The driver unit 842 provides a range of motion in two orthogonal directions, $R_X$ and $R_Y$.

A controller 850 includes an XY drive motor controller 852, which is a process (or module) for controlling independent adjustments to positions of the movable heating elements 840. The XY The controller 850 also includes a second process (or module) 854 for controlling the power supplied to each heating element 840.

The controller 850 may also include a processor that receives feedback signals and computes the desired position and heating power for each of the movable heating elements 840. The positional adjustments are limited so that the movable heating elements 840 do not bump into each other. For example, movement of each element 840 from its default position (the center of its range of motion) may be limited to a distance of less than one half of the distance between the nearest surfaces of two adjacent XY stages 842 when both stages 842 are centered in their default positions.

In other embodiments, the controller 850 has one or more tables for providing predetermined configurations of heating element positions and power levels for a plurality of feedback scenarios.

FIG. 9 is a block diagram of a photolithographic system in which the hot plate 801 may be used. The system includes a coater 902 (such as a Tractrix™ Spin Tool sold by Site Services, Inc. of Santa Clara, Calif.) for applying a photoresist to a substrate. A scanner 904 exposes the photoresist through a mask to form a desired pattern. A developer 906 applies a solution to harden desired portions of the photoresist after exposure. A scanning electron microscope 908 measures the CD of a pattern at a plurality of locations on the wafer and determines the CDU. The SEM 908 may be integrated into the developer. An etcher 910 removes the undesired portion of the photoresist and the underlying film in the substrate.

As shown in FIG. 9, the process may be adjusted in either or both of two different ways. The heating elements 840 of the hot plate 801 in the coater 902 may be adjusted to increase or decrease local temperatures to adjust the uniformity of application of the photoresist film. Adjustments to the local temperature of the wafer in the coater 902 result in local adjustments to the thickness of the photoresist deposited in the coater.

Alternatively, the heating elements 840 of the hot plate 801 in the developer 906 may be adjusted. Portions of a positive photoresist that have been exposed becomes soluble during post exposure bake (PEB). By adjusting the local temperature on the wafer during the PEB, the desired portions of the photoresist are more evenly rendered soluble, facilitating CD uniformity.

Figure 10:
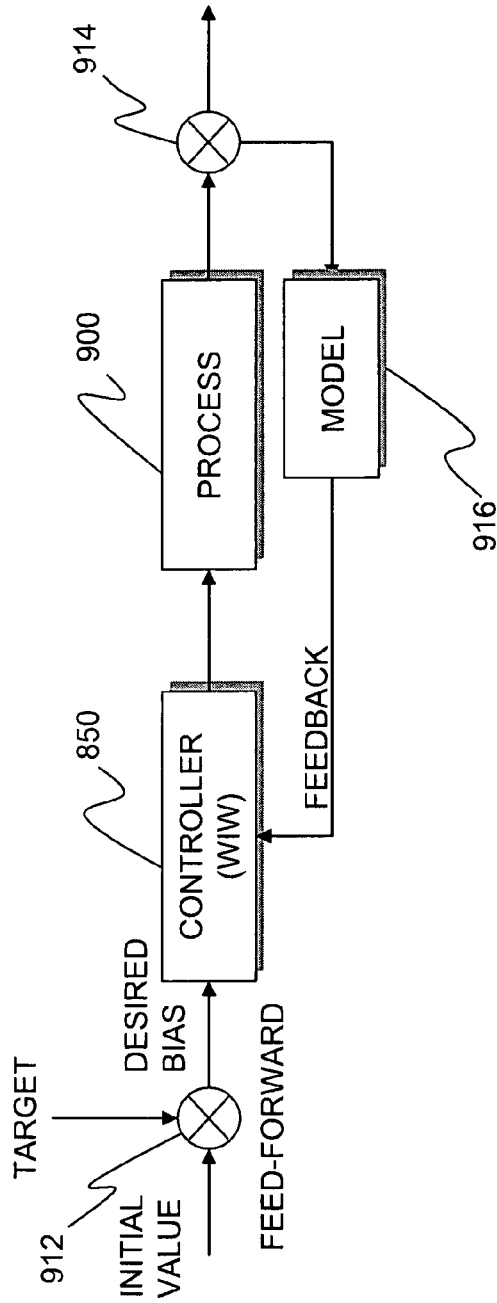
FIG. 10 is a block diagram of the control system for the process of FIG. 9.

FIG. 10 is a block diagram of the control of the system in FIG. 9.

For an incoming wafer, initial values may be provided by SEM measurements prior to applying the photoresist to the substrate. For example, the substrate may already have patterns formed by a previous processing step. The CD of these patterns may be measured, and any variation in the CD can be identified. Any topography in the wafer can be identified at this step. The initial SEM measurements are used as feed-forward information for the process.

At node 912, the feed-forward information is compared with the target CD data to determine an initial desired bias for the process. This information is used to initially define the desired heat input to the temperature zones. This input is implemented by the controller 850.

The controller 850 operates the heating elements 840 in the manner described above with reference to FIGS. 8A and 8B. These heat inputs affect the operation of the processing equipment shown in FIG. 9. The controller may include an embedded proportional-integral-derivative (PID) control mechanism that varies the heater power based on the difference between the target CD and the CD input to the controller.

At node 914, the wafer is output from the developer, and the SEM CD data are fed into a model 916. The model 916 receives as inputs the CD data from the plurality of locations, and identifies a set of heating element positions and heating power levels to improve the photoresist thickness and/or the CDU.

For example, the model 916 may identify the cold spots in the wafer (based on the CD data), and assume that each of the heating elements 840 is moved as much as possible towards the nearest cold spot. Then the heating power to be supplied to each of the heating elements 840 is estimated. A thermal module (not shown) within the model 916 can calculate the temperature distribution throughout the wafer based on the heat input values. The temperature distribution can then be input to a CD module (not shown) which estimates the CD at a plurality of locations on the wafer based on the estimated temperature distribution. If the predicted CD uniformity is within a convergence criterion, then the model can output this set of heating element positions and power levels to the controller 850, for use in the next process run. If the convergence criterion is not met, then the model 916 may perform additional iterations by re-running the temperature distribution prediction and CD distribution projection using a different set of heater input power levels. After plural iterations, if none of the sets of heater positions and power levels satisfies the model's convergence criterion, then the set of positions and heating powers providing the best predicted CDU is selected. In some embodiments, the automatic process controller will calculate the predicted CD base on the input from nodes 914 and 912. The CD mean may be compensated by using the stepper to adjust the exposure dose, and the CD uniformity (CDU) may be controlled by the hot-plate with this flexible temperature control unit.

Figure 11:
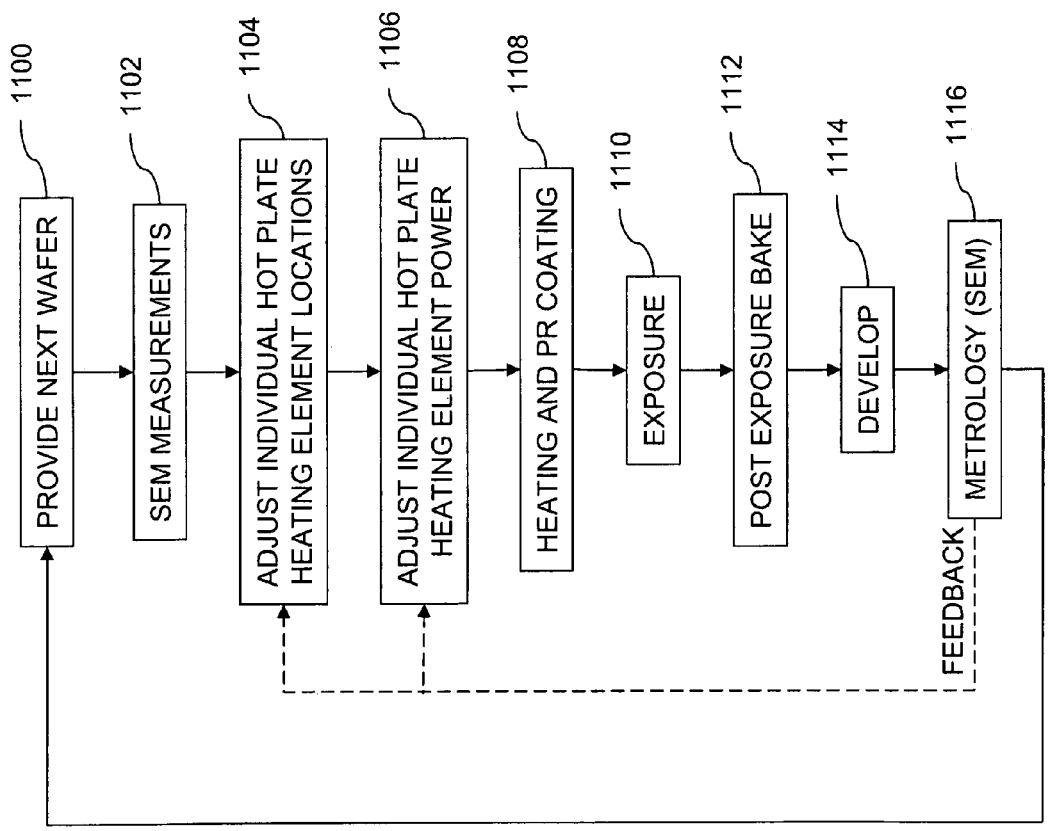
FIG. 11 is a flow chart of a process with independent temperature control in the coater.

FIG. 11 is a flow chart of a method of using the apparatus of FIGS. 8A and 8B. FIG. 11 depicts the process as an ongoing process that is repeated as long as wafers are supplied.

At step 1100, an $N^{th}$ semiconductor substrate (wafer) is provided (where N is an integer). The $N^{th}$ wafer is supported by a hot plate. The $N^{th}$ wafer may have already undergone previous fabrication processes and may have patterns formed on it.

At step 1102, initial SEM measurements of the Nth wafer may be made to feed forward to the process.

Steps 1104 and 1106 are both performed in the hot plate of the coater 902. At step 1104, the positions of individual heating elements 840 of the hot plate 801 are independently adjusted. If this is the first process run (first wafer), then a set of default positions may be used (e.g., the center of the range of motion for each heating element 840). If the $N^{th}$ wafer is a second or subsequent wafer, then the position adjustment for the Nth wafer is based on the CD feedback data from the metrology (SEM) 1116 from the $N-1^{th}$ wafer. (In alternative embodiments, the adjustments may be based on the CD feedback from another recent previously processed wafer, if adjustments are made each time a predetermined number of wafers are processed, or each time a fixed period of time elapses).

At step 1106, the heating power supplied to each individual heating element 840 of the hot plate 801 is adjusted. If this is the first process run (first wafer), then a set of default power levels may be used (e.g., the average expected heating power). If the $N^{th}$ wafer is a second or subsequent wafer, then the heating power adjustment for the $N^{th}$ wafer is based on the CD feedback data from the metrology (SEM) 1116 of the $N-1^{th}$ wafer (or other recent previous wafer used to determine position adjustments).

At step 1108, the $N^{th}$ wafer is coated with a photoresist, while the heaters 840 apply heat at the desired locations, at the desired power levels.

At step 1110, the $N^{th}$ wafer is exposed in the scanner.

At step 1112, PEB is performed to activate the photo acid produced during the resist exposure. The acid attacks the bonds of the resist in a self-catalyzing sequence, making them soluble in developer solution. Heat is applied at the positions determined in step 1104.

At step 1114, the developer chemical is applied. The portions of the photoresist that were rendered soluble are removed.

At step 1116, the SEM measures a CD at a plurality of locations on the $N^{th}$ semiconductor substrate (wafer) supported by the hot plate. The CD feedback from the SEM of the $N^{th}$ wafer is provided to the model, which generates a new set of heating element positions and power levels to be used in the next iterations of steps 1104 and 1106, for processing the $N+1^{th}$ wafer.

Figure 12:
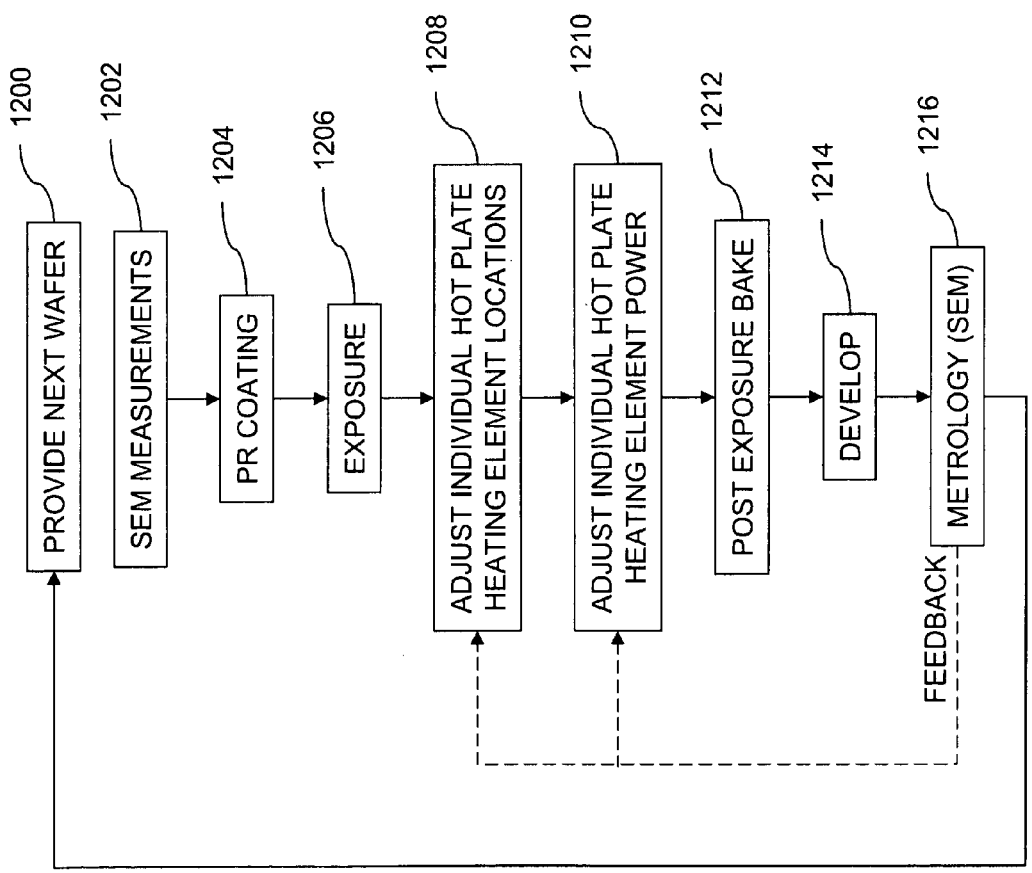
FIG. 12 is a flow chart of a process with independent temperature control in the developer.

FIG. 12 is a flow chart of a variation of the method of FIG. 11, in which the hot plate temperatures are controlled and adjusted in during the PEB step.

At step 1200, an $N^{th}$ semiconductor substrate (wafer) is provided, (where N is an integer). The $N^{th}$ wafer is supported by a hot plate. The $N^{th}$ wafer may have already undergone previous fabrication processes and may have patterns formed on it.

At step 1202, initial SEM measurements of the $N^{th}$ wafer may be made to feed forward to the process.

At step 1204, the $N^{th}$ wafer is coated with a photoresist.

At step 1206, the $N^{th}$ wafer is exposed in the scanner.

Steps 1208 and 1210 are both performed in the hot plate of the developer 902 before and during PEB. At step 1208, the positions of individual heating elements 840 of the hot plate 801 are independently adjusted. If this is the first process run (first wafer), then a set of default positions may be used (e.g., the center of the range of motion for each heating element 840). If the $N^{th}$ wafer is a second or subsequent wafer, then the position adjustment for the $N^{th}$ wafer is based on the CD feedback data from the metrology (SEM) 1216 from the $N-1^{th}$ wafer. (In alternative embodiments, the adjustments may be based on the CD feedback from another recent previously processed wafer, if adjustments are made each time a predetermined number of wafers are processed, or each time a fixed period of time elapses).

At step 1210, the heating power supplied to each individual heating element 840 of the hot plate 801 is adjusted. If this is the first process run (first wafer), then a set of default power levels may be used (e.g., the average expected heating power). If the $N^{th}$ wafer is a second or subsequent wafer, then the heating power adjustment is based on the CD feedback data from the metrology (SEM) 1216 of the $N-1^{th}$ wafer (or other recent previous wafer used to determine position adjustments).

At step 1212, PEB is performed to activate the photo acid produced during the resist exposure. Heat is applied at the positions determined in step 1208 by heaters 840 at the desired locations and power levels.

At step 1214, the developer chemical is applied. The portions of the photoresist that were rendered soluble are removed.

At step 1216, the SEM measures a CD at a plurality of locations on the $N^{th}$ semiconductor substrate (wafer) supported by the hot plate. The CD feedback from the SEM of the $N^{th}$ wafer is provided to the model, which generates a new set of heating element positions and power levels to be used in the next iterations of steps 1208 and 1210, for processing the $N+1^{th}$ wafer.

FIG. 13 is a diagram of an alternative hot plate 1301 having a different heating structure. Instead of providing movable heating elements 840 (as discussed above with respect to FIG. 8B), a large number of independently controlled heating elements 1340 are provided. The heating elements 1340 can be fixed-location resistive elements. The size of the heating elements 1340 is sufficiently small, and the number of heating elements is sufficiently large that the heating adjustments can be made electrically, instead of mechanically. By selecting and deselecting any subset of the heating elements 1340, the hot plate 1301 independently adjusts the positions at which heat is applied to the substrate. The power supplied to each of the active heating elements can be varied to adjust temperature, as discussed above with reference to FIG. 8B.

Use of the apparatus of FIGS. 8A-13 enables within wafer process control, and improves the coating and PEB steps to improve photoresist thickness uniformity and CDU.

Apparatus and methods have been described above to collect data from different locations on a wafer on a first process run, calculate proper equipment or process settings for the individual locations through automatic process control, and to run the adjusted process on another wafer.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
performing an ion implantation process on a semiconductor wafer supported by a platen or electrostatic chuck; and
supplying first and second different coolant fluids to respective first and second fluid conduits in or adjacent to the platen or electrostatic chuck in respective first and second zones of the platen or electrostatic chuck, to independently control the temperature of the wafer in respective first and second portions of the wafer adjacent to the first and second zones of the platen or electrostatic chuck during the ion implantation process, wherein said first and second coolant fluids have different compositions.

2. The method of claim 1, wherein the supplying step includes supplying respectively different coolants from the group consisting of liquid hydrogen, liquid helium, liquid nitrogen, liquid oxygen, liquid methane, and liquid nitrous oxide from respectively different chilling or refrigeration units.

3. The method of claim 1, further comprising independently controlling the supply of the first and second coolants to the first and second zones at respectively different temperatures so as to maintain a substantially uniform wafer temperature across the wafer.

4. The method of claim 3, wherein the supplying step includes chilling the first and second coolants in respectively different chilling or refrigeration units.

5. The method of claim 1, wherein the temperature is controlled during the ion implantation to form an amorphous region in the wafer, the method further comprising annealing the wafer after the ion implantation.

6. The method of claim 1, wherein the wafer has a plurality of concentric annular zones, the plurality of concentric annular zones including the first and second zones.

7. The method of claim 6, wherein the wafer has a third concentric annular zone, and the method further comprises supplying a third coolant fluids to a third fluid conduit in or adjacent to the platen or electrostatic chuck in the third zone of the platen or electrostatic chuck, to independently control the temperature of the wafer in a third portion of the wafer adjacent to the third zones of the platen or electrostatic chuck during the ion implantation process.

8. The method of claim 6, wherein the first and second annular zones are each divided into plural angular zones, the method further comprising separately controlling the temperature within plural angular zones.

9. The method of claim 1, further comprising:
collecting temperature feedback data using a plurality of sensors on or in the platen or electrostatic chuck; and
using the temperature feedback data to control the temperature in each zone.

10. A method comprising:
performing an ion implantation process on a semiconductor wafer supported by a platen or electrostatic chuck; and
supplying first and second different coolant fluids to respective first and second fluid conduits in or adjacent to the platen or electrostatic chuck in respective first and second zones of the platen or electrostatic chuck, to independently control the temperature of the wafer in respective first and second portions of the wafer adjacent to the first and second zones of the platen or electrostatic chuck during the ion implantation process,
wherein the step of supplying first and second different coolant fluids includes:
supplying the coolant fluid in each zone at a respective substantially constant supply temperature; and
varying a volumetric flow rate of coolant fluid supplied in each zone.

11. The method of claim 10, further comprising using a table in a controller to determine the volumetric flow rate of coolant fluid supplied each zone.

12. The method of claim 1, wherein the step of supplying first and second different coolant fluids includes:
supplying the coolant fluids in each zone at a respective substantially constant supply temperature; and
varying a duty cycle of coolant fluid flow in each zone.

13. The method of claim 12, further comprising using a table in a controller to determine the duty cycle for supplying coolant fluid in each zone.

14. The method of claim 1, further comprising varying the temperature of at least one of the coolant fluids supplied to at least one of the zones.

15. The method of claim 1, wherein the first coolant fluid is liquid methane and the second coolant fluid is liquid nitrogen.

16. A method comprising:
performing an ion implantation process on a semiconductor wafer supported by a platen or electrostatic chuck; and
chilling first and second coolants in respectively different chilling or refrigeration units;
supplying the first and second different coolant fluids to respective first and second fluid conduits in or adjacent to the platen or electrostatic chuck in respective first and second concentric annular zones of the platen or electrostatic chuck, wherein the supplying step includes supplying respectively different coolants from the group consisting of liquid hydrogen, liquid helium, liquid nitrogen, liquid oxygen, liquid methane, and liquid nitrous oxide from respectively different chilling or refrigeration units, so as to maintain a substantially uniform wafer temperature across the wafer; and
independently controlling the temperature of the wafer in respective first and second portions of the wafer adjacent to the first and second zones of the platen or electrostatic chuck during the ion implantation process so that an amorphous region is formed in the wafer, including
collecting temperature feedback data using a plurality of sensors on or in the platen or electrostatic chuck; and
using the temperature feedback data to control the temperature in each zone; and
annealing the wafer after the ion implantation.

17. The method of claim 16, wherein the first and second annular zones are each divided into plural angular zones, the method further comprising separately controlling the temperature within plural angular zones.

18. The method of claim 16, wherein the step of supplying first and second different coolant fluids includes:
supplying the coolant fluid in each zone at a respective substantially constant supply temperature; and
varying a volumetric flow rate of coolant fluid or duty cycle of coolant fluid flow supplied in each zone.

19. The method of claim 10, further comprising using a table in a controller to determine the volumetric flow rate or duty cycle of coolant fluid flow supplied in each zone.

20. A method comprising:
performing an ion implantation process on a semiconductor wafer supported by a platen or electrostatic chuck; and
chilling first and second coolants in respectively different chilling or refrigeration units;
supplying the first and second different coolant fluids to respective first and second fluid conduits in or adjacent to the platen or electrostatic chuck in respective first and second concentric annular zones of the platen or electrostatic chuck, wherein the supplying step includes supplying respectively different coolants from the group consisting of liquid hydrogen, liquid helium, liquid nitrogen, liquid oxygen, liquid methane, and liquid nitrous oxide from respectively different chilling or refrigeration units, so as to maintain a substantially uniform wafer temperature across the wafer; and
independently controlling the temperature of the wafer in respective first and second portions of the wafer adjacent to the first and second zones of the platen or electrostatic chuck during the ion implantation process so that an amorphous region is formed in the wafer, including
collecting temperature feedback data using a plurality of sensors on or in the platen or electrostatic chuck; and
using the temperature feedback data to control the temperature in each zone;
supplying the coolant fluid in each zone at a respective substantially constant supply temperature;
using a table in a controller to determine the volumetric flow rate of coolant fluid supplied each zone, and
varying a volumetric flow rate of coolant fluid supplied in each zone;
annealing the wafer after the ion implantation.

* * * * *